United States Patent
Park et al.

(10) Patent No.: US 9,173,303 B2
(45) Date of Patent: Oct. 27, 2015

(54) ANISOTROPIC CONDUCTIVE FILM AND APPARATUS INCLUDING THE SAME

(75) Inventors: Young Woo Park, Uiwang-si (KR); Arum Amy Yu, Uiwang-si (KR); Nam Ju Kim, Uiwang-si (KR); Hyun Min Choi, Uiwang-si (KR); Jin Seong Park, Uiwang-si (KR); Dong Seon Uh, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 183 days.

(21) Appl. No.: 13/311,920

(22) Filed: Dec. 6, 2011

(65) Prior Publication Data

US 2012/0168213 A1 Jul. 5, 2012

(30) Foreign Application Priority Data

Dec. 29, 2010 (KR) ........................ 10-2010-0138216

(51) Int. Cl.
*C09K 19/00* (2006.01)
*H05K 3/32* (2006.01)
(Continued)

(52) U.S. Cl.
CPC ...... *H05K 3/323* (2013.01); *B32B 7/02* (2013.01); *B32B 27/08* (2013.01); *B32B 27/18* (2013.01); *B32B 27/26* (2013.01); *B32B 27/38* (2013.01); *C08J 5/18* (2013.01); *C09J 163/00* (2013.01);
(Continued)

(58) Field of Classification Search
CPC ........ C09J 163/00; C08J 5/18; C08J 2362/00; H05K 3/323; H01R 4/04; G02F 1/13452; H01L 24/29–24/30; H01L 24/32; H01L 24/33; H01L 2224/2929; B32B 27/08; B32B 27/38; B32B 2307/202; B32B 2307/706; B32B 2250/02; B32B 2250/24; Y10T 428/1055; Y10T 428/1059
USPC ........... 428/1.1, 1.5, 1.53, 1.4, 413, 414, 415, 428/416, 417, 418; 156/330; 252/513, 514, 252/512; 525/523, 524; 174/257
See application file for complete search history.

(56) References Cited

U.S. PATENT DOCUMENTS 6,223,429 B1 * 5/2001 Kaneda et al. ................. 29/832
7,645,514 B2 * 1/2010 Watanabe et al. ............ 428/416
(Continued)

FOREIGN PATENT DOCUMENTS

JP 2005146043 A * 6/2005
KR 10-2006-0120646 A 11/2006
(Continued)

OTHER PUBLICATIONS

Korean Office Action dated Jul. 19, 2013.
(Continued)

*Primary Examiner* — Ruiyun Zhang
(74) *Attorney, Agent, or Firm* — Lee & Morse, P.C.

(57) ABSTRACT

An apparatus includes a first member including a plurality of first electrodes on a first substrate, a second member including a plurality of second electrodes on a second substrate, the second electrodes facing the first electrodes of the first member, and an anisotropic conductive film (ACF) between the first member and the second member, the ACF having a double-layered structure and electrically connecting the first member and the second member, the ACF including an epoxy resin with a polycyclic aromatic ring and exhibiting a minimum melt viscosity of about 3,000 Pa·s to about 10,000 Pa·s at about 30° C. to about 200° C.

16 Claims, 2 Drawing Sheets

(51) Int. Cl.
*C09J 163/00* (2006.01)
*B32B 7/02* (2006.01)
*B32B 27/08* (2006.01)
*B32B 27/18* (2006.01)
*B32B 27/26* (2006.01)
*B32B 27/38* (2006.01)
*C08J 5/18* (2006.01)
*G02F 1/1345* (2006.01)
*H01R 4/04* (2006.01)

(52) U.S. Cl.
CPC ......... *G02F 1/13452* (2013.01); *B32B 2250/02* (2013.01); *B32B 2250/24* (2013.01); *B32B 2264/102* (2013.01); *B32B 2264/12* (2013.01); *B32B 2307/202* (2013.01); *B32B 2307/706* (2013.01); *B32B 2457/202* (2013.01); *C08J 2363/00* (2013.01); *H01R 4/04* (2013.01); *Y10T 428/1055* (2015.01)

(56) References Cited

U.S. PATENT DOCUMENTS 7,901,768 B2  3/2011  Kumakura
2003/0178132 A1* 9/2003 Shinozaki ................ 156/275.5

FOREIGN PATENT DOCUMENTS

TW    I263285 B    10/2006
TW    I314571 A    9/2009

OTHER PUBLICATIONS

Taiwanese Office action dated Jun. 5, 2014 for TW 100143329 (Park, et al.)

* cited by examiner

ANISOTROPIC CONDUCTIVE FILM AND APPARATUS INCLUDING THE SAME

BACKGROUND

1. Field

Example embodiments relate to an anisotropic conductive film and an apparatus including the same. More particularly, example embodiments relate to a double layered anisotropic conductive film, which includes an epoxy resin containing a polycyclic aromatic ring to increase minimum melt viscosity and to improve connection reliability, and to an apparatus including the same.

2. Description of the Related Art

As displays become larger and thinner, a pitch between electrodes and circuits in the displays becomes more precise. An anisotropic conductive film (ACF) may be used as a wiring material to connect fine terminals of such electrodes and circuits. For example, the ACF may be used as a connection material for packaging a liquid crystal display (LCD) panel, a printed circuit board (PCB), or a driver IC of a LCD module.

For example, in the LCD module, a plurality of driver integrated circuits (ICs) is mounted to drive thin film transistor (TFT) patterns. The driver ICs may be mounted on a LCD panel by a wire bonding method, i.e., where the driver ICs are connected to an electrode of the LCD panel through a conductive wire, by a tape automated bonding (TAB) method, i.e., where the driver ICs are mounted on an electrode of the LCD panel using a base film, and/or by a chip on glass (COG) method, i.e., where the driver ICs are mounted directly on the LCD panel using an adhesive. For example, the ACF may be used as a connection material for the COG method or to electrically connect a wiring pattern designed based on a polyimide substrate and an indium tin oxide (ITO) pattern designed on a glass substrate of a LCD panel or a lead of an electronic component.

SUMMARY

An aspect of the example embodiments provides an apparatus, including a first member including a plurality of first electrodes on a first substrate, a second member including a plurality of second electrodes on a second substrate, the second electrodes facing the first electrodes of the first member, and an anisotropic conductive film (ACF) between the first member and the second member, the ACF having a double-layered structure and electrically connecting the first member and the second member, the ACF including an epoxy resin with a polycyclic aromatic ring and exhibiting a minimum melt viscosity of about 3,000 Pa·s to about 10,000 Pa·s at about 30° C. to about 200° C.

The ACF may exhibit a melt viscosity of about 5,000 Pa·s to about 7,100 Pa·s at about 100° C.

The epoxy resin with the polycyclic aromatic ring may be present in an amount of about 20 wt % to about 60 wt % in the ACF, based on a total dry weight of the ACF.

The ACF may include a first conductive layer and a second non-conductive layer, a combined minimum melt viscosity of the first and second layers of the ACF is about 3,000 Pa·s to about 10,000 Pa·s at about 30° C. to about 200° C.

The first conductive layer of the double layered ACF may exhibit a minimum melt viscosity of about 10,000 Pa·s to about 100,000 Pa·s at about 30 to about 200° C.

The first conductive layer may include about 5 wt % to about 50 wt % of the epoxy resin, about 15 wt % to about 25 wt % of a phenoxy resin, about 20 wt % to about 40 wt % of conductive particles, about 1 wt % to about 10 wt % of inorganic fillers, and about 14 wt % to about 20 wt % of a curing agent.

The epoxy resin may include at least one epoxy resin containing a tetrafunctional polycyclic aromatic ring.

A weight ratio of the epoxy resin to the inorganic fillers in the first conductive layer may be about 3:1 to about 6:1.

The second non-conductive layer of the double layered ACF may exhibit a minimum melt viscosity of about 1,000 to about 5,000 Pa·s at about 30 to about 200° C.

The second non-conductive layer may include about 10 wt % to about 50 wt % of the epoxy resin, about 20 wt % to about 30 wt % of a phenoxy resin, about 1 wt % to about 10 wt % of inorganic fillers, and about 29 wt % to about 50 wt % of a curing agent.

The epoxy resin may include at least one epoxy resin containing a bifunctional polycyclic aromatic ring.

A weight ratio of the epoxy resin to the inorganic fillers in the second non-conductive layer may be about 4:1 to about 10:1.

A thickness ratio of the first conductive layer to the second non-conductive layer may be about 1:1 to about 5:1.

The epoxy resin with the polycyclic aromatic ring may have a glass transition temperature (Tg) of about 165° C. to about 250° C.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0138216, filed on Dec. 29, 2010, in the Korean Intellectual Property Office, and entitled: "Double Layered Anisotropic Conductive Film and Apparatus Comprising the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

One aspect of the example embodiments provides a double layered ACF having a minimum melt viscosity of about 3,000 Pa·s to about 10,000 Pa·s at about 30° C. to about 200° C. For example, the double layered ACF may have a minimum melt viscosity of about 5,000 Pa·s to about 7,100 Pa·s at about 80° C. to about 120° C., e.g., at about 100° C.

It is noted that "melt viscosity" is the viscosity of a molten polymer and is measured according to the following method. For example, the melt viscosity of the double layered ACF may be determined using a capillary rheometer (ARES G2, TA Instruments). The double layered ACF is heated in the rheometer barrel and is forced through a die with a plunger at a strain of 5% and a frequency of 1 rad/s from about 30° C. to about 200° C., while elevating the temperature at a rate of 10° C./min, using a the parallel plate type of an aluminum disposable plate (Diameter: 8 mm). Measurements are taken once the system has reached steady-state operation.

It is further noted that "minimum melt viscosity" is defined as a minimum value among melt viscosities measured from about 30° C. to about 200° C. when determining "melt viscosity," as described above. At the minimum melt viscosity, a driver IC comes in contact with an electrode of a panel, at which the ACF begins to be cured.

In one embodiment, the double layered ACF may include an epoxy resin containing a polycyclic aromatic ring. The epoxy resin containing the polycyclic aromatic ring denotes a resin in which at least two aromatic rings are connected (or fused) to each other and a functional group containing at least one epoxy group is coupled to the aromatic rings directly or through an atom, e.g., through oxygen, carbon, or sulfur.

The epoxy resin containing the polycyclic aromatic ring may have a glass transition temperature (Tg) of about 165° C. to about 250° C. When the Tg is lower than 165° C., heat transfer may occur during film-on-glass (FOG) compression, i.e., at about 160° C., thereby causing damage to the ACF and increasing reliability resistance. When the Tg is higher than 250° C., the high temperature may cause a workability problem with respect to compressing the ACF.

For example, the epoxy resin containing the polycyclic aromatic ring may have a structure represented by Formula 1 below.

(Ar)n-Em

In Formula 1, Ar is a polycyclic aromatic hydrocarbon, n is the number of aromatic rings included in Ar, e.g., from 2 to 10 rings, E is a functional group coupled to Ar, i.e., one of an epoxy group, a glycidyl group, and a glycidyloxy group, and m is the number of Es, e.g., from 1 to 5 Es. For example, n may be about 2 to 4, and m may be about 2 to 4.

In other words, "(Ar)n" refers to a polycyclic aromatic hydrocarbon having n aromatic rings. "Em" refers to m functional groups, e.g., epoxy groups, glycidyl groups, and/or lycidyloxy groups, coupled to the polycyclic aromatic hydrocarbon "Ar".

The polycyclic aromatic ring may include at least one substituent of C1 to C10 alkyl groups, C1 to C10 alkoxy groups, C6 to C20 aryl groups, and halogen.

The epoxy resin containing the polycyclic aromatic ring may include, e.g., epoxy resins containing a tetrafunctional or bifunctional polycyclic aromatic ring.

For example, an epoxy resin containing a tetrafunctional polycyclic aromatic ring may include an epoxy resin having at least two aromatic rings coupled (or fused) to each other and four functional groups, e.g., epoxy groups, glycidyl groups, and/or glycidyloxy groups, coupled to the aromatic rings. For example, the epoxy resin containing the tetrafunctional polycyclic aromatic ring may be a naphthalene tetrafunctional epoxy resin having a naphthalene moiety in a rigid structure represented by Formula 2 below.

[Formula 2]

In Formula 2, each of $E_1$, $E_2$, $E_3$, and $E_4$ is an epoxy group, a glycidyl group, or a glycidyloxy group, and R is a C1 to C10 alkylene group. For example, each of $E_1$, $E_2$, $E_3$, and $E_4$ may be a glycidyloxy group, and R may be a C1 to C5 alkylene group.

The epoxy resin containing the tetrafunctional polycyclic aromatic ring may be synthesized by any suitable method or may be a commercially available product. For example, the epoxy resin containing the tetrafunctional polycyclic aromatic ring may be a compound having a structure represented by Formula 3 below, i.e., HP4700 (Dainippon Ink & Chemicals, Inc.).

[Formula 3]

In another example, an epoxy resin containing a bifunctional polycyclic aromatic ring may include an epoxy resin having at least two aromatic rings coupled (or fused) to each other and two functional groups, e.g., epoxy groups, glycidyl groups, or glycidyloxy groups, coupled to the aromatic rings. For example, an epoxy resin containing the bifunctional polycyclic aromatic ring may be a bifunctional epoxy resin having a structure represented by Formulae 4, 5, or 6 below.

[Formula 4]

[Formula 5]

[Formula 6]

In Formulae 4-6 above, each of $E_1$ and $E_2$ is an epoxy group, a glycidyl group, or a glycidyloxy group, and R is a C1 to C10 alkylene group or —CH=N. For example, each of $E_1$ and $E_2$ may be a glycidyloxy group, and R may be a C1 to C5 alkylene group.

Example of the epoxy resin containing the bifunctional polycyclic aromatic ring may include 1,6-bis(2,3-epoxypropoxy)naphthalene, 1,5-bis(2,3-epoxypropoxy)naphthalene, 2,2'-bis(2,3-epoxypropoxy)binaphthalene, 2,7-bis(2,3-epoxypropoxy)naphthalene, 4,4'-bis(2,3-epoxypropoxy)benzylideneaniline, 2,2'-bis(2,3-epoxypropoxy)biphenyl, and 4,4'-bis(2,3-epoxypropoxy)biphenyl.

The epoxy resin containing the bifunctional polycyclic aromatic ring may be synthesized by any suitable method or may be a commercially available product. For example, the epoxy resin containing the bifunctional polycyclic aromatic ring may be a compound having a structure represented by Formula 7 below, i.e., HP4032D (1,6-bis(2,3-epoxypropoxy)naphthalene, Dainippon Ink & Chemicals, Inc.).

[Formula 7]

The epoxy resin containing the polycyclic aromatic ring may be present in the double layered ACF in an amount of about 20 wt % to about 60 wt %, e.g., about 40 wt % to about 60 wt %, based on a total dry weight of the ACF. Within this range, due to high resistance to pressure in thermal pressing, pressure unbalance does not occur and it is not difficult to connect a driver IC and a panel. In other words, connection between the driver IC and panel may be facilitated, as uniformity of pressure application is increased, i.e., due to high resistance to pressure.

In contrast, when a conventional ACF, i.e., an ACF without an epoxy resin containing a polycyclic aromatic ring, is used to connect a driver IC and a panel, the low viscosity of the conventional ACF causes the ACF to have a low resistance to pressure, thereby causing non-uniform pressure application across the ACF during heating and pressing in a bonding process. As such, portions on the driver IC may have different contact resistances in accordance with differences in applied pressure, thereby reducing connection reliability. However, the epoxy resin containing the polycyclic aromatic ring according to example embodiments increases the remaining amount of conductive particles to resolve pressure unbalance after pressing, thereby improving connection reliability.

In example embodiments, the double layered ACF may include a first conductive layer and a second non-conductive layer, i.e., a non-conductive film (NCF).

The first conductive layer may have a minimum melt viscosity of about 10,000 Pa·s to about 100,000 Pa·s at about 30° C. to 200° C. For example, the first layer may have a minimum melt viscosity of about 10,000 Pa·s to about 100,000 Pa·s, e.g., about 10,000 Pa·s to about 30,000 Pa·s, at about 80° C. to 120° C., e.g., at about 100° C. The second layer of the ACF, i.e., the NCF layer, may have a minimum melt viscosity of about 1,000 Pa·s to about 5,000 Pa·s at about 30° C. to 200° C. For example, the second layer may have a minimum melt viscosity of about 1,000 Pa·s to about 5,000 Pa·s, e.g., about 1,000 Pa·s to about 3,000 Pa·s, at about 80° C. to 120° C., e.g., at about 100° C. When the first and second layers are combined to form a double layered ACF, a combined minimum melt viscosity of the double layered ACF, i.e., of the first and second layers of the ACF, may be about 3,000 Pa·s to about 10,000 Pa·s at about 30° C. to about 200° C.

The epoxy resin containing the polycyclic aromatic ring may be included in at least one of the first layer and the second layer. For example, the epoxy resin containing the polycyclic aromatic ring may be included in each of the first layer and the second layer. For example, the first layer may include at least one epoxy resin containing a tetrafunctional polycyclic aromatic ring, and the second layer may include at least one epoxy resin containing a bifunctional polycyclic aromatic ring.

The epoxy resin containing the polycyclic aromatic ring may be present in an amount of about 5 wt % to about 50 wt % in the first layer, e.g., about 15 wt % to about 35 wt %, and may be present in an amount of about 10 wt % to about 50 wt %, e.g., about 25 wt % to about 40 wt %, in the second layer. Within this range, due to high resistance to pressure in thermal pressing, pressure unbalance does not occur and it is not difficult to connect a driver IC and a panel.

In another embodiment, the ACF may include an epoxy resin containing a polycyclic aromatic ring, a phenoxy resin, conductive particles, inorganic fillers, and a curing agent in the first layer, and an epoxy resin containing a polycyclic aromatic ring, a phenoxy resin, inorganic fillers, and a curing agent in the second layer, i.e., the NCF layer. The epoxy resin containing the polycyclic aromatic ring may include epoxy resins as described above.

The phenoxy resin refers to a resin including a phenoxy moiety, e.g., bisphenol A phenoxy resins. The phenoxy resin serves as a matrix in each of the first and second layers of the ACF, and may include resins having a low Tg. For example, the phenoxy resin may have a Tg of about 60° C. to about 80° C.

The phenoxy resin may be present in an amount of about 15 wt % to about 25 wt % in the first layer, e.g., about 15 wt % to about 20 wt %, based on a total dry weight of the first layer. The phenoxy resin may be present in an amount of about 20 wt % to about 30 wt % in the second layer, e.g., about 20 wt % to about 25 wt %, based on a total dry weight of the second layer. Within this range, film formation can be eased and proper reliability can be obtained.

The conductive particles may include metal particles, or organic or inorganic particles coated with metal, such as gold or silver. Further, the conductive particles may include insulated conductive particles to secure electrical insulating properties when excessively used. Examples of conductive particle may include at least one of Ni, Pd, Cu, Ag, Al, Ti, Cr, and Au. Further examples of conductive particles may include carbon. Additional examples of conductive particles may include particles of at least polyethylene, polypropylene, polyester, polystyrene, polyvinyl alcohol, and/or modified resins thereof coated with metal, e.g., gold, silver, and/or nickel. The coated particles may be further coated with insulating particles.

The conductive particles may have an average diameter ($D_{50}$) of about 2 μm to about 30 μm, e.g., about 2 μm to about 6 μm, which may be changed depending on the pitch of a circuit. The conductive particle may be present in an amount of about 20 wt % to about 40 wt % in the first layer, e.g., about 30 wt % to about 35 wt %, based on a total dry weight of the first layer. Within this range, excellent connection reliability can be obtained and a short circuit does not occur.

The inorganic fillers improve adhesive and insulating properties of the conductive film. The inorganic fillers may include, e.g., nano-silica.

When the first layer and the second layer use the epoxy resin containing the polycyclic aromatic ring as an epoxy resin and use nano-silica as the inorganic fillers, pressure unbalance may be substantially resolved. The inorganic fillers, e.g., nano-silica, may have an average diameter ($D_{50}$) of about 1 nm to about 100 nm, e.g., about 1 nm to about 20 nm, and may have a circular shape.

The inorganic fillers may be present in an amount of about 1 wt % to about 10 wt % in the first layer, and may be present in an amount of about 1 wt % to about 10 wt % in the second layer. For example, the inorganic fillers may be present in the amount of about 5 wt % to about 10 wt % in the first layer, and may be present in an amount of about 5 wt % to about 10 wt % in the second layer. Within this range, connection in a Z direction may be stable, e.g., does not worsen, and electrodes are not damaged.

In the first layer, a weight ratio of the epoxy resin containing the polycyclic aromatic ring to the inorganic fillers may be about 3:1 to about 6:1, e.g., about 3.5:1 to about 6:1. Within this range, pressure on bumps may be uniformly maintained in X, Y, and Z directions, so that the ACF may have improved connection reliability.

In the second layer, a weight ratio of the epoxy resin containing the polycyclic aromatic ring to the inorganic fillers may be about 3:1 to about 10:1, e.g., about 4:1 to about 8:1. Within this range, the non-conductive film may uniformly disperse pressure and realize proper contact resistance.

The curing agent cures the epoxy resin containing the polycyclic aromatic ring to form the first layer, i.e., the ACF, and second layer, i.e., the NCF. Examples of the curing agent may include latent curing agents. For example, the curing agent may include at least one of imidazole, isocyanate, amine, imide, phenolic, and anhydride curing agents.

The curing agent may be present in an amount of about 14 wt % to about 20 wt % in the first layer, based on a total dry weight of the first layer, and may be present in an amount of about 29 wt % to about 50 wt % in the second layer, based on a total dry weight of the second layer. For example, the amount of the curing agent may be about 15 wt % to about 20 wt % in the first layer, and may be about 35 wt % to about 40 wt % in the second layer. Within this range, curing may be sufficiently performed and good compatibility can be obtained.

For example, the first layer may include about 5 wt % to about 50 wt % of the epoxy resin containing the polycyclic aromatic ring, about 15 wt % to about 25 wt % of the phenoxy resin, about 20 wt % to about 40 wt % of the conductive particle, about 1 wt % to about 10 wt % of the inorganic fillers, and about 14 wt % to about 20 wt % of the curing agent.

For example, the second layer may include about 10 wt % to about 50 wt % of the epoxy resin containing the polycyclic aromatic ring, about 20 wt % to about 30 wt % of the phenoxy resin, about 1 wt % to about 10 wt % of the inorganic fillers, and about 29 wt % to about 50 wt % of the curing agent.

Each of the first layer and the second layer may further include at least one additional epoxy resin, e.g., a bisphenol epoxy resin, a novolac epoxy resin, an alicyclic epoxy resin, and/or an amine epoxy resin.

Figure 2:
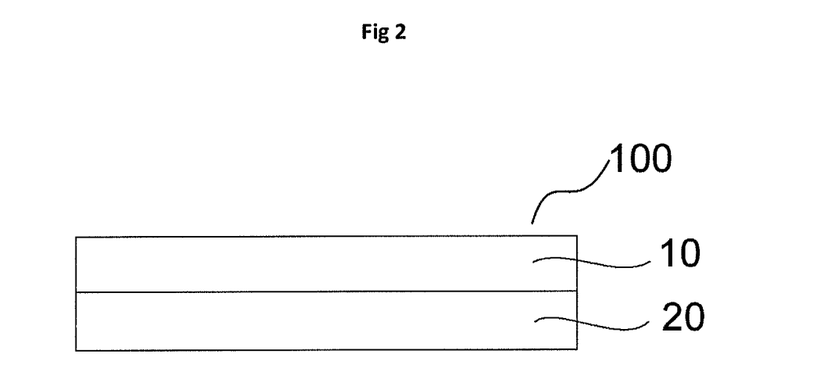
FIG. 2 illustrates a cross-sectional view of a double layered ACF according to example embodiments.

FIG. 2 is a cross-sectional view of a double layered ACF 100 according to an example embodiment. As shown in FIG. 2, the double layered ACF 100 has a structure in which a first conductive layer 10 is deposited on, e.g., directly on, a second non-conductive layer 20. For example, the double layered ACF 100 is disposed such that the second non-conductive layer 20 is connected to chips to be bonded, and the first conductive layer 10 is connected to a substrate, e.g., glass.

In the double layered ACF 100, a thickness ratio of the first conductive layer 10 to the second non-conductive layer 20 may be about 1:1 to about 5:1. The double layered ACF may have a total thickness of about 12 μm to about 20 μm, and each of the first conductive layer 10 and the second non-conductive layer 20 may have a thickness of about 5 μm to about 15 μm.

The double layered ACF 100 may be prepared by the following process. Preparing a second non-conductive layer by depositing and drying a non-conductive film composition including an epoxy resin containing a polycyclic aromatic ring, a phenoxy resin, inorganic fillers, a curing agent, and a solvent on a release film, preparing a first conductive layer by depositing and drying a conductive layer composition including an epoxy resin containing a polycyclic aromatic ring, a phenoxy resin, conductive particles, inorganic fillers, a curing agent, and a solvent on a release film, and bonding the first conductive layer and the second non-conductive layer, e.g., via lamination. The epoxy resin containing the polycyclic aromatic ring, phenoxy resin, conductive particles, inorganic fillers, and curing agent are the same as those described above.

The solvent uniformly mixes the epoxy resin containing the polycyclic aromatic ring, phenoxy resin, conductive particles, curing agent, and inorganic fillers, and decreases the viscosity of the compositions, thereby facilitating formation of the films. The solvent may include any suitable solvent, e.g., at least one of toluene, xylene, propylene glycol monomethyl ether acetate, benzene, acetone, methyl ethyl ketone, tetrahydrofuran, dimethylformamide, and cyclohexanone.

The bonding may be performed by laminating the non-conductive film and the conductive film. Laminating is generally known to those skilled in the art and may be performed at properly adjusted temperature and pressure. For example, laminating may be conducted at about 40° C. and about 1 MPa.

The compositions for forming the first layer or the second layer may further include additives, e.g., a polymerization inhibitor, an antioxidant, a heat stabilizer, a curing accelerator, a coupling agent, or the like, in order to provide additional properties, without hindering basic properties. The additives may be present in an amount of about 0.1 to about 5 parts by weight based on 100 parts by weight of the double layered ACF.

Examples of the polymerization inhibitor may include at least one of hydroquinone, hydroquinone monomethyl ether, p-benzoquinone, and phenothiazine. Examples of the antioxidant may include branched phenolic or hydroxyl cinnamates. Examples of the curing accelerator may include at least one of solid imidazole accelerators and solid and liquid amine curing accelerators. Examples of the coupling agent may include at least one of silane coupling agents, such as vinyltrichlorosilane, vinyltrimethoxysilane, 3-glycidoxypropyltrimethoxysilane, 2-aminoethyl-3-aminopropylmethyldimethoxysilane, 3-methacryloxypropyltrimethoxysilane, and 3-ureidopropyltriethoxysilane.

Another aspect of the example embodiments provides an apparatus including the double layered ACF 100. The apparatus may include various display apparatuses and semiconductor devices, e.g., a liquid crystal display (LCD), using an ACF for connection of modules.

Figure 3:
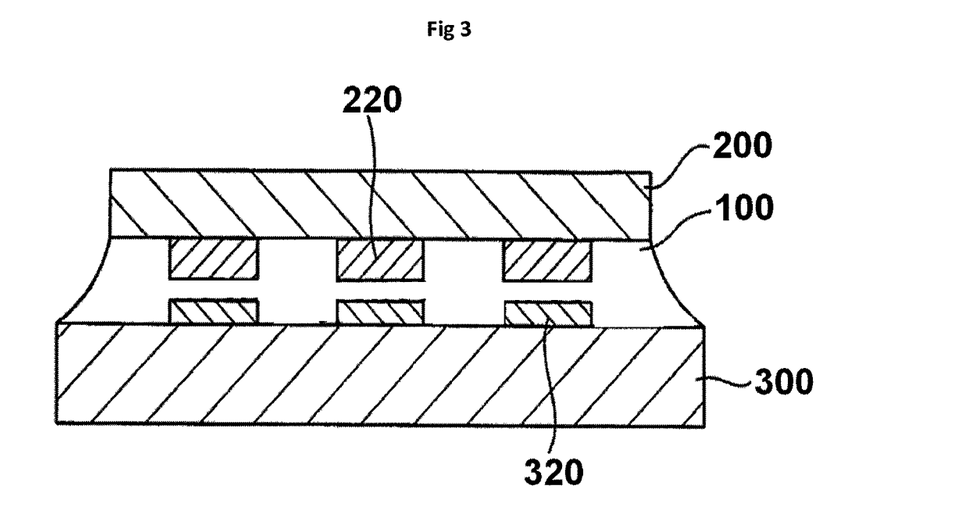
FIG. 3 illustrates a cross-sectional view of a semiconductor device according to example embodiments.

FIG. 3 is a cross-sectional view of a semiconductor device according to an example embodiment. Referring to FIG. 3, the semiconductor device may include a first member, i.e., a first substrate 300 and a plurality of first electrodes 320 formed on the first substrate 300, a second member, i.e., a second substrate 200 and a plurality of second electrodes 220 formed on the second substrate 200 and facing the first electrodes 320 of the first member. The ACF 100 may be disposed between the first member and the second member, and may be electrically connecting the first member to the second member.

In one embodiment, the first and second members may be substrates, e.g., a tape carrier package (TCP), a chip on film (COF), a flexible printed circuit board (FPCB), outer lead bonding of ITO or IZO glass, or a printed circuit board (PCB). For example, the first member may be a TCP, a COF, an FPCB, a driving chip, or the like, and the second member may be OLB ITO or IZO glass, PCB, glass, or the like.

In one embodiment, the apparatus may include a substrate, driving chips mounted on the substrate, and an ACF electrically connecting the substrate and the driving chips, wherein the ACF is the double layered ACF 100 described previously. The double layered ACF may be provided such that the second non-conductive layer is connected to the driving chips, and the first conductive layer is connected to the substrate. In addition to the driving chips, a pad may be formed on the substrate. Further, a bump may be formed on the driving chips. In one embodiment, the pad and the bump may be formed in corresponding positions. In another embodiment, a substrate, e.g., a FPCB, may be employed instead of the driving chips.

Hereinafter, the constitution and functions of the invention will be explained in more detail with reference to the following examples. These examples are provided for illustrative purposes only and are not to be in any way construed as limiting the example embodiments. A description of details apparent to those skilled in the art will be omitted.

EXAMPLES

Example 1

Preparation of a Double Layered ACF

1. Preparation of a Non-Conductive Layer 30 parts by weight of an epoxy resin (HP4032D, Glass transition temperature: 170° C., Dainippon Ink & Chemicals, Inc.), 25 parts by weight of a phenoxy resin (PKHH, Inchemrez, USA), 40 parts by weight of a latent curing agent (HX3941HP, microencapsulated, Asahi Kasei Chemicals Corp.), 5 parts by weight of nano-silica (R972, Diameter: 7 nm, Degussa), and 100 parts by weight of xylene as a solvent were mixed. The solution was deposited on a polyethylene terephthalate (PET) release film and dried in a dryer at 70° C. to volatilize the solvent, thereby producing a non-conductive film (Thickness: 12 µm).

2. Preparation of a Conductive Layer 30 parts by weight of an epoxy resin (HP4700, Glass transition temperature: 245° C., Dainippon Ink & Chemicals, Inc.), 15 parts by weight of a phenoxy resin (PKHH, Inchemrez, USA), 20 parts by weight of a latent curing agent (HX3941HP, microencapsulated, Asahi Kasei Chemicals Corp.), 30 parts by weight of conductive particles (AUL-704, Average diameter (D50): 4 µm, Sekisui Chemical Co., Ltd., JP), 5 parts by weight of nano-silica (R972, Diameter: 7 nm, Degussa), and 100 parts by weight of xylene as a solvent were mixed. The solution was deposited on a PET release film and dried in a dryer at 70° C. to volatilize the solvent, thereby producing an ACF (Thickness: 8 µm).

3. Preparation of a Double Layered ACF

The prepared conductive layer and the prepared non-conductive layer were bonded at 40° C. and 1 MPa via lamination to produce a double layered ACF. The conductive layer was deposited on the non-conductive layer.

Examples 2 and 3

Preparation of Double Layered ACF

Double layered ACFs were prepared in the same manner as in Example 1, except that nano-silica and a curing agent were added according to Table 1.

Comparative Examples 1 and 2

Double layered ACFs were prepared in the same manner as in Example 1, except that the components were used according to compositions listed in Table 1.

TABLE 1

|  | Example 1 | | Example 2 | | Example 3 | | Comparative Example 1 | | Comparative Example 2 | |
| --- | --- | --- | --- | --- | --- | --- | --- | --- | --- | --- |
|  | ACF | NCF | ACF | NCF | ACF | NCF | ACF | NCF | ACF | NCF |
| Epoxy resin 1 (wt %) | 30 | 30 | 30 | 30 | 30 | 30 | 0 | 0 | 30 | 30 |
| Epoxy resin 2 (wt %) | 0 | 0 | 0 | 0 | 0 | 0 | 30 | 30 | 0 | 0 |
| Phenoxy resin (wt %) | 15 | 25 | 15 | 25 | 15 | 25 | 15 | 25 | 15 | 25 |
| Conductive particle (wt %) | 30 | 0 | 30 | 0 | 30 | 0 | 30 | 0 | 30 | 0 |
| Inorganic fillers (wt %) | 5 | 5 | 7 | 7 | 10 | 7 | 5 | 5 | 0 | 0 |
| Curing agent (wt %) | 20 | 40 | 18 | 38 | 15 | 38 | 20 | 40 | 25 | 45 |

Epoxy resin 1: Epoxy resin containing polycyclic aromatic ring
Epoxy resin 2: Bisphenol A epoxy resin (YD128, Kukdo Chemical Co., Ltd.)
NCF: a non-conductive layer of a double-layered ACF
ACF: a conductive layer of a double-layered ACF Experimental Examples Minimum melt viscosity and contact resistance were measured as follows. Results are shown in Table 2.

<Evaluation Methods of Physical Properties>

1. Minimum Melt Viscosity

Figure 1:
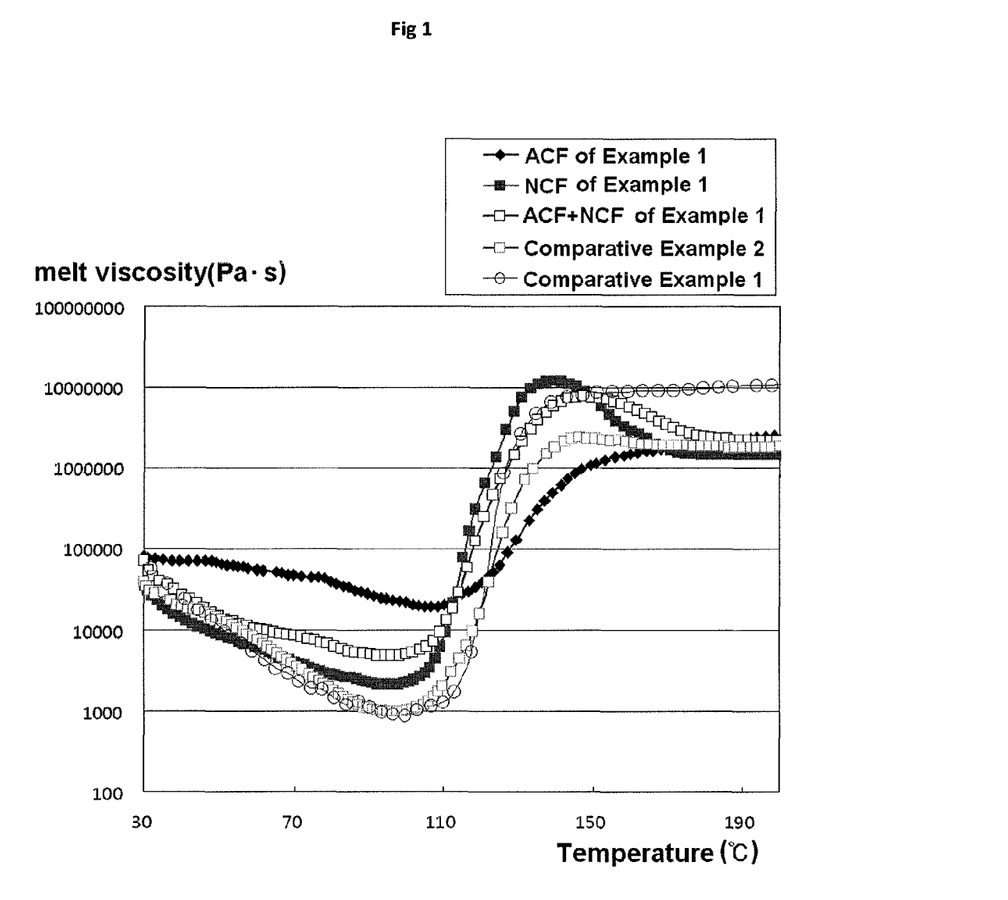
FIG. 1 illustrates a graph of melt viscosities of an ACF, a non-conductive film (NCF), a double layered ACF (ACF+NCF) according to Example 1, and a double layered ACF according to Comparative Examples 1 and 2, measured from about 30 to 200° C., wherein the x axis is temperature (° C.) and the y axis is melt viscosity (Pa·s)

Minimum melt viscosity was measured at a strain of 5% and a frequency of 1 rad/s from about 30° C. to 200° C., while elevating the temperature at a rate of 10° C./min, using a parallel plate type of an aluminum disposable plate (Diameter: 8 mm, ARES G2, TA Instruments). Melt viscosities from 30° C. to 200° C. were recorded. FIG. 1 shows records of melt viscosities of the conductive layer, non-conductive layer, the double layered ACF (ACF+NCF) according to Example 1, and the double layered ACFs according to Comparative Examples 1 and 2, measured from about 30 to 200° C.

2. Contact Resistance (Initial Resistance and Resistance after Reliability Testing)

As adherents, an IC chip with a bump area of 1430 $\mu m^2$ and a glass substrate having an indium tin oxide (ITO) circuit with a thickness of 5000 Å were used. Each of the layers, i.e., ACF/NCF, was disposed between the adherents and heat-pressed at 200° C. and 60 MPa for 5 seconds, thereby preparing a sample. The electric resistance of the sample was measured by application of 1 mA current using a Hioki Hi-Tester, Hioki. To evaluate resistance after reliability testing, the sample was left under high-temperature and high-humidity conditions (85° C./85% RH) for 500 hours, and then left, middle, and right contact resistances were measured.

driver IC has in heat pressing. As a result, respective bumps in the driver IC may have different contact resistances depending on differences in applied pressures, thereby reducing connection reliability.

In detail, hundreds of bumps of a driver IC are distributed irregularly, e.g., bumps of an input unit have a large size and bumps of an output unit have small size, and there are a few or none bumps on opposite lateral sides of the driver IC. In the output unit, hundreds of bumps are arranged in one, two, or three rows and some bumps are disposed irregularly. Thus, when pressure is applied to the conventional ACF to bond the ACF to the driver IC, the pressure may not be uniformly transferred to all the respective bumps because of the low viscosity of the ACF. Further, the conventional AFC may not exhibit sufficient physical/adhesive properties for a reduced size of a driver IC, i.e., thinner driver IC and a smaller active area with a smaller dead space of a display product.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the example embodiments as set forth in the following claims.

What is claimed is:

1. An apparatus, comprising:
a first member including a plurality of first electrodes on a first substrate;

TABLE 2

| Properties | | Example 1 | | Example 2 | | Example 3 | | Comparative Example 1 | | Comparative Example 2 | |
|---|---|---|---|---|---|---|---|---|---|---|---|
| | | ACF | NCF | ACF | NCF | ACF | NCF | ACF | NCF | ACF | NCF |
| Minimum melt viscosity (Pa·s) | | 22000 | 2100 | 28000 | 2600 | 17000 | 2600 | 8800 | 1020 | 6500 | 600 |
| Minimum melt viscosity (Pa·s) | | 5300 | | 6500 | | 7100 | | 870 | | 1028 | |
| Initial resistance [Ω] | Left Bump | 3.2 | | 3.6 | | 2.5 | | 2.2 | | 2.3 | |
| | Middle Bump | 3.4 | | 3.5 | | 2.7 | | 3.4 | | 3.2 | |
| | Right Bump | 3.3 | | 3.9 | | 2.7 | | 2.3 | | 2.5 | |
| | Pressure | Normal | | Normal | | Normal | | Excessive | | Excessive | |
| Resistance after reliability testing [Ω] | Left bump after 500 Hr | 3.8 | | 4.3 | | 5.2 | | 19.5 | | 12.7 | |
| | Middle bump after 500 Hr | 4.0 | | 4.2 | | 3.8 | | 3.9 | | 4.2 | |
| | Right bump after 500 Hr | 3.7 | | 4.7 | | 5.9 | | 18.9 | | 18.5 | |
| | Evaluation [good: <10 Ω] | ○ | | ○ | | ○ | | X | | X | |

* Minimum melt viscosity: Minimum value among melt viscosities from about 30° C. to 200° C.

As can be seen from Table 2, the double layered ACFs according to example embodiments have high minimum melt viscosity to resolve pressure unbalance, thereby exhibiting high connection reliability. Further, when the ACFs include an epoxy resin containing a polycyclic aromatic ring and nano-silica as inorganic fillers, pressure unbalance can be further resolved. In addition, the double layered ACFs have a low deviation of contact resistance, thereby increasing connection reliability.

In contrast, a conventional ACF, i.e., an ACF formed of an epoxy resin containing no polycyclic aromatic ring, may include a bisphenol A (BPA) epoxy resin or a bisphenol F (BPF) epoxy resin and a phenoxy resin, and may exhibit low curing viscosity. Thus, the conventional ACF may exhibit low resistance to pressure applied in pressing, excessively high overflow of the resins, and a low reaction rate. As such, the conventional ACF has uneven distribution of pressure as the a second member including a plurality of second electrodes on a second substrate, the second electrodes facing the first electrodes of the first member; and
an anisotropic conductive film (ACF) disposed between the first member and the second member, the ACF having a double-layered structure and electrically connecting the first member and the second member, the double-layered structure including a first conductive layer and a second non-conductive layer, wherein:
a minimum melt viscosity of the first conductive layer is higher than a minimum melt viscosity of the second non-conductive layer,
the minimum melt viscosity of the first conductive layer is 10,000 Pa·s to 100,000 Pa·s at about 30° C. to about 200° C., and
the ACF includes an epoxy resin with a polycyclic aromatic ring, a phenoxy resin, conductive particles, a curing agent, and inorganic fillers, wherein the epoxy resin with the polycyclic aromatic ring is in an amount of about 30 wt % to about 60 wt % based on total weight of the ACF, and exhibits a combined minimum melt viscosity of the first and second layers of the ACF of about 3,000 Pa·s to about 10,000 Pa·s at about 30° C. to about 200° C.

2. The apparatus as claimed in claim 1, wherein the ACF exhibits a combined minimum melt viscosity of the first and second layers of the ACF of about 5,000 Pa·s to about 7,100 Pa·s at about 100° C.

3. The apparatus as claimed in claim 1, wherein the first conductive layer includes about 5 wt % to about 50 wt % of the epoxy resin, about 15 wt % to about 25 wt % of the phenoxy resin, about 20 wt % to about 40 wt % of the conductive particles, about 1 wt % to about 10 wt % of the inorganic fillers, and about 14 wt % to about 20 wt % of the curing agent.

4. The apparatus as claimed in claim 3, wherein the epoxy resin includes at least one epoxy resin containing a tetrafunctional polycyclic aromatic ring.

5. The apparatus as claimed in claim 3, wherein a weight ratio of the epoxy resin to the inorganic fillers in the first conductive layer is about 3:1 to about 6:1.

6. The apparatus as claimed in claim 3, wherein the second non-conductive layer of the double layered ACF exhibits a minimum melt viscosity of about 1,000 Pa·s to about 5,000 Pa·s at about 30° C. to about 200° C.

7. The apparatus as claimed in claim 6, wherein the second non-conductive layer includes about 10 wt % to about 50 wt % of the epoxy resin, about 20 wt % to about 30 wt % of the phenoxy resin, about 1 wt % to about 10 wt % of the inorganic fillers, and about 29 wt % to about 50 wt % of the curing agent.

8. The apparatus as claimed in claim 1, wherein the second non-conductive layer of the double layered ACF exhibits a minimum melt viscosity of about 1,000 Pa·s to about 5,000 Pa·s at about 30° C. to about 200° C.

9. The apparatus as claimed in claim 1, wherein the second non-conductive layer includes about 10 wt % to about 50 wt % of the epoxy resin, about 20 wt % to about 30 wt % of phenoxy resin, about 1 wt % to about 10 wt % of the inorganic fillers, and about 29 wt % to about 50 wt % of the curing agent.

10. The apparatus as claimed in claim 9, wherein the epoxy resin includes at least one epoxy resin containing a bifunctional polycyclic aromatic ring.

11. The apparatus as claimed in claim 9, wherein a weight ratio of the epoxy resin to the inorganic fillers in the second non-conductive layer is about 4:1 to about 10:1.

12. The apparatus as claimed in claim 1, wherein a thickness ratio of the first conductive layer to the second non-conductive layer is about 1:1 to about 5:1.

13. The apparatus as claimed in claim 1, wherein the epoxy resin with the polycyclic aromatic ring has a glass transition temperature (Tg) of about 165° C. to about 250° C.

14. An apparatus, comprising:
a first member including a plurality of first electrodes on a first substrate;
a second member including a plurality of second electrodes on a second substrate, the second electrodes facing the first electrodes of the first member; and
an anisotropic conductive film (ACF) disposed between the first member and the second member, the ACF having a double-layered structure and electrically connecting the first member and the second member, the double-layered structure including a first conductive layer and a second non-conductive layer,
wherein:
the ACF includes an epoxy resin with a polycyclic aromatic ring, a phenoxy resin, conductive particles, a curing agent, inorganic fillers, and the epoxy resin with the polycyclic aromatic ring being in an amount of about 30 wt % to about 60 wt % based on total weight of the ACF,
the first conductive layer includes about 5 wt % to about 50 wt % of the epoxy resin, about 15 wt % to 25 wt % of the phenoxy resin, about 20 wt % to about 40 wt % of the conductive particles, about 1 wt % to about 10 wt % of the inorganic fillers, and about 14 wt % to about 20 wt % of the curing agent, and
the second non-conductive layer includes about 10 wt % to about 50 wt % of the epoxy resin, about 20 wt % to about 30 wt % of the phenoxy resin, about 1 wt % to about 10 wt % of the inorganic fillers, and about 29 wt % to about 50 wt % of the curing agent.

15. The apparatus as claimed in claim 14, wherein:
a weight ratio of the epoxy resin to the inorganic fillers in the first conductive layer is about 3:1 to about 6:1, and
a weight ratio of the epoxy resin to the inorganic fillers in the second non-conductive layer is about 4:1 to about 10:1.

16. The apparatus as claimed in claim 14, wherein a minimum melt viscosity of the first conductive layer is 10,000 Pa·s to 100,000 Pa·s at about 30° C. to about 200° C.

* * * * *